(12) United States Patent
Bronner et al.

(10) Patent No.: US 6,344,389 B1
(45) Date of Patent: Feb. 5, 2002

(54) SELF-ALIGNED DAMASCENE INTERCONNECT

(75) Inventors: Gary B. Bronner, Stormville, NY (US); Jeffrey P. Gambino, Gaylordsville, CT (US); Carl J. Radens, LaGrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/294,076

(22) Filed: Apr. 19, 1999

(51) Int. Cl.$^7$ .......................................... H01L 21/8242
(52) U.S. Cl. ..................... 438/244; 438/595; 438/396; 438/397; 438/239
(58) Field of Search ................................ 438/239, 244, 438/248, 253, 256, 396, 397, 399, 595

(56) References Cited

U.S. PATENT DOCUMENTS

| | | |
|---|---|---|
| 4,953,125 A | 8/1990 | Okumura et al. |
| 5,206,183 A | 4/1993 | Dennison |
| 5,362,666 A | 11/1994 | Dennison |
| 5,386,131 A | 1/1995 | Sato |
| 5,429,979 A | 7/1995 | Lee et al. |
| 5,488,011 A | 1/1996 | Figura et al. |
| 5,500,384 A | 3/1996 | Melzner |
| 5,501,998 A | 3/1996 | Chen |
| 5,554,557 A | 9/1996 | Koh |
| 5,565,372 A | 10/1996 | Kim |
| 5,580,811 A | 12/1996 | Kim |
| 5,639,682 A | 6/1997 | Choe |
| 5,654,223 A | 8/1997 | Jun et al. |
| 5,858,833 A * | 1/1999 | Lee et al. .................... 438/253 |

FOREIGN PATENT DOCUMENTS

JP          8-274278          10/1996

* cited by examiner

Primary Examiner—Charles Bowers
Assistant Examiner—Yennhu B. Huynh
(74) Attorney, Agent, or Firm—McGinn & Gibb, PLLC; Todd M.C. Li

(57) ABSTRACT

A structure and method for a capacitor-over-bitline integrated circuit device includes forming a device on a substrate, forming a capacitor contact electrically connected to the device, forming a bitline trench using the capacitor contact to align the bitline trench, forming insulating spacers in the bitline trench, forming a conductive bitline in the trench, the bitline being electrically connected to the device, forming an inter-layer dielectric over the bitline, and forming a capacitor above the inter-layer dielectric, such that the capacitor is electrically connected to the capacitor contact.

17 Claims, 5 Drawing Sheets

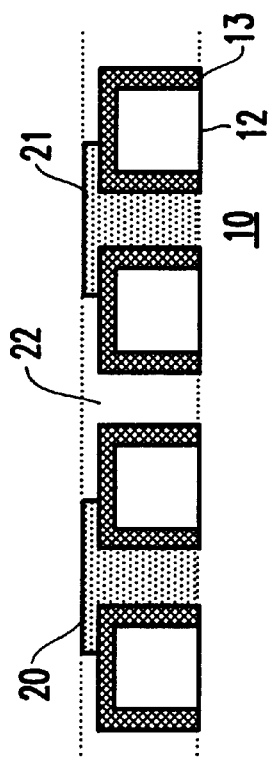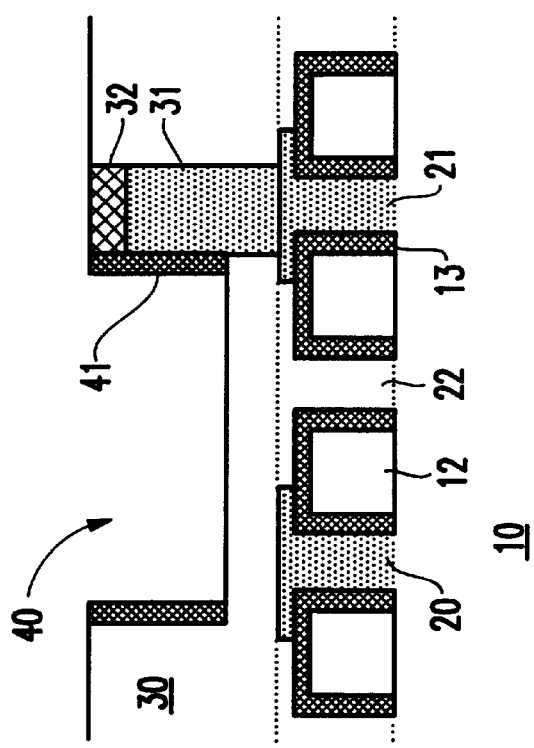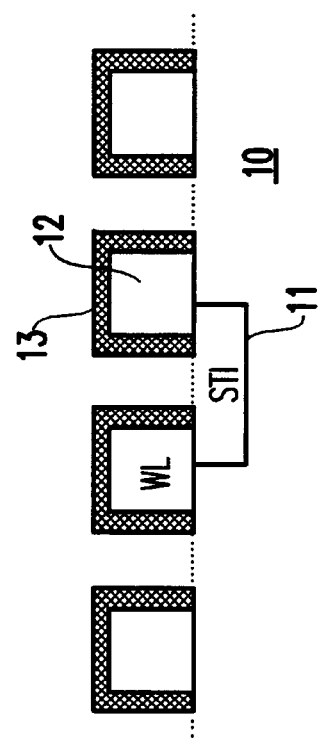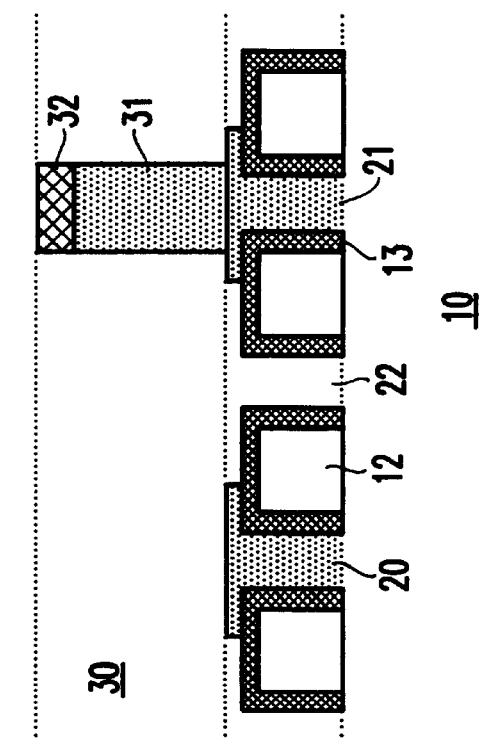

SELF-ALIGNED DAMASCENE INTERCONNECT

BACKGROUND OF THE INVENTION

1. Field of the Invention

The present invention generally relates to the multilevel interconnection of integrated circuit devices and more particularly to a DRAM device having a capacitorover-bitline (COB) structure wherein the capacitor contact is formed before the bitline to reduce circuit size and increase manufacturing efficiency.

2. Description of the Related Art

Generally, integrated circuits contain multilevel interconnection structures including wire levels and via contact levels which serve to route the flow of data, signal, and power throughout the chip. In the case of advanced high-density integrated circuit chips which contain a regular array of circuit features, such as a dynamic random access memory chip (DRAM), static random access memory (SRAM), or other programmable array devices, there can include arrays of features such as wires which are printed at a minimum pitch of lines and spaces. It may be advantageous and desirable to route an interconnection via which passes through the minimum-pitch array from a lower level to an upper level of wiring.

One example of a minimum pitch array of wires is a DRAM bitline level within a DRAM array which may include a storage device, such as a capacitor, a transistor controlling the flow of data to and from the storage device and a wordline for activating and deactivating the transistor. In addition, a capacitor contact may make electrical connection between the transistor and the capacitor and, similarly, a bitline contact may make electrical connection between the bitline and the transistor. In stacked DRAM technology, the capacitor can be located above or below the bitline. Structures which include the capacitor above the bitline are sometimes referred to as DRAM stacked capacitor-over-bitline (COB) devices.

Conventional DRAMs which include the capacitor below the bitline suffer from the disadvantage that the capacitor often shorts against the bitline contact. The capacitor-over-bitline structure is superior because it eliminates this type of defect.

With the capacitor-over-bitline structure, the capacitor contact is usually adjacent the bitline and can be separated from the bitline by insulating spacers. Conventional bitlines in capacitor-over-bitline structures are formed using common deposition, masking and etching techniques, such as reactive ion etching (RIE). Then the conventional processes form sidewall spacers along the bitline and subsequently form the capacitor contact adjacent the side wall spacers.

However, the sidewall spacers tend to limit the space available for the capacitor contact which decreases device performance and increases the defect rate as the devices are reduced in size. Essentially, the conventional processing for manufacturing a COB structure prohibits the device from being made smaller and, therefore, limits the device density of a given integrated circuit device. The conventional capacitor over-bitline structure may also provide separation between the capacitor contact and the bitline by increasing the spacing between these structures, and, hence increasing the overall area required for the chip. The present invention enables a compacting of overall chip area by providing a self-aligned interconnect structure which may be generally applicable to the fabrication of integrated circuits.

SUMMARY OF THE INVENTION

It is therefore an object of the present invention to provide a structure and method for a self-aligned multi-level interconnect structure capacitor-over-bitline integrated circuit device comprising forming a field effect transistor on a substrate, forming a capacitor contact electrically connected to the field effect transistor, forming a bitline trench using the capacitor contact to align the bitline trench, forming insulating spacers in the bitline trench, forming a conductive bitline in the trench, the bitline being electrically connected to the field effect transistor, forming an inter-layer dielectric over the bitline, and forming a capacitor above the inter-layer dielectric, such that the capacitor is electrically connected to the capacitor contact.

The forming of the insulating spacers includes forming one of the insulating spacers on the capacitor contact. The forming of the capacitor contact includes forming a cap above the capacitor contact, wherein the cap protects the capacitor contact during the forming of the bitline trench and the cap aligns the bitline trench with the capacitor contact. The forming of the bitline comprises depositing a conductive material in the bitline trench using a damascene process.

A method of manufacturing a multilevel interconnection comprises forming a first wiring level, forming a first insulator over the first wiring level, forming a contact electrically connected to the first wiring level, forming a trench in the insulator using the to contact to align the trench, forming spacers in the trench, forming an intermediate wiring level in the trench, forming an insulator over the intermediate wiring level and forming a second wiring level above the insulator, such that the second wiring level is electrically connected to the contact.

The forming of the spacers includes forming one of the spacers on the contact. The forming of the contact includes forming a cap above the contact, wherein the cap protects the contact during the forming of the trench and the cap aligns the trench with the contact. The forming of the intermediate wiring level comprises depositing a conductive material in the trench using a damascene process. The size of the contact is unaffected by the spacers.

The invention enables the size reduction of the bitline wiring level spacing and prevents the capacitor contact from being reduced in size by the spacers. Therefore, the more critical capacitor contact size is not jeopardized and instead the less critical bitline size is slightly decreased. Thus, the invention allows a smaller stacked DRAM capacitorover-bitline structure to be manufactured, which allows for a higher density integrated circuit device, decreases manufacturing costs, decreases defects and increases efficiency.

Those skilled in the art will recognize that the structure and method described in this invention will have general applicability to the formation of multilevel interconnection integrated circuit devices, and not be limited to the DRAM and capacitorover bitline structure. The capacitor-over bitline structure described serves as an illustrative embodiment where the capacitor may be substituted for a wiring interconnection level.

BRIEF DESCRIPTION OF THE DRAWINGS

The foregoing and other objects, aspects and advantages will be better understood from the following detailed description of preferred embodiments of the invention with reference to the drawings, in which:

FIG. 1 is a schematic diagram of a cross-sectional view of a partially formed integrated circuit according to the invention;

FIG. 2 is a schematic diagram of a cross-sectional view of a partially formed integrated circuit according to the invention;

FIG. 3 is a schematic diagram of a cross-sectional view of a partially formed integrated circuit according to the invention;

FIG. 4 is a schematic diagram of a cross-sectional view of a partially formed integrated circuit according to the invention;

DETAILED DESCRIPTION OF PREFERRED EMBODIMENTS OF THE INVENTION

The invention enables the interconnection of a capacitor or upper wiring level to a substrate or lower wiring level (while maintaining electrical isolation from an intermediate bitline wire or middle wiring level) and allows capacitor-over-bitline stacked DRAM structures to be constructed which are smaller than the conventional structures. The present inventors found that the size of the capacitor contact was more critical than the size of the bitline. In other words, it was found that a reduction in the size of the bitline produced substantially less defects than a similar reduction in the size of the capacitor contact.

In order to take advantage of this finding, the invention forms the capacitor contact before the bitline. More specifically, and as explained in greater detail below, the invention forms the capacitor contact and subsequently forms sidewall spacers on the capacitor contact. At a later time, the bitline is formed, using for example a damascene process. The invention prevents the capacitor contact from being reduced in size by the spacers. Therefore, the more critical capacitor contact size is not jeopardize and instead the less critical bitline size is slightly decreased. Thus, the invention allows a smaller stacked DRAM capacitor-over-bitline structure to be manufactured, which allows for a higher density integrated circuit device, decreases manufacturing costs, decreases defects and increases efficiency.

Figure 10:
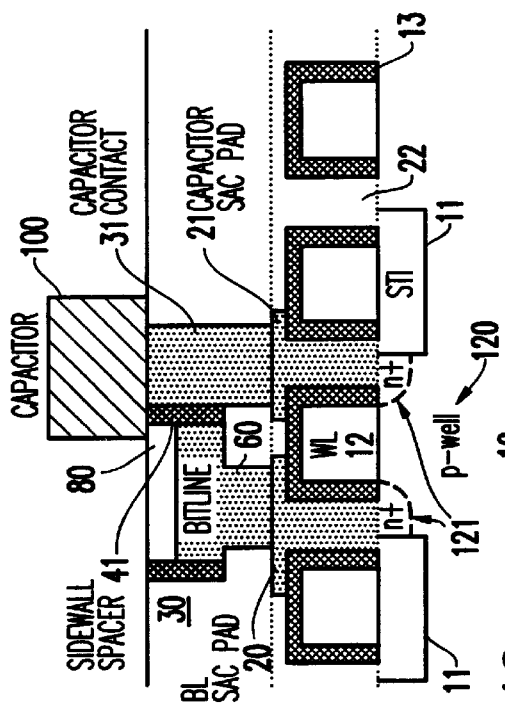
FIG. 10 is a schematic diagram of a cross-sectional view of a partially formed integrated circuit according to the invention.
Figure 11:
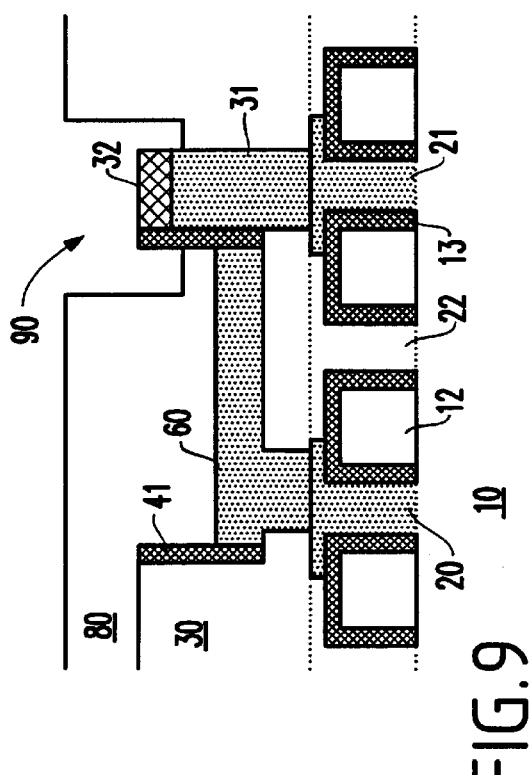
FIG. 11 is a schematic diagram of a cross-sectional view of a partially formed integrated circuit according to the invention.
Figure 12:
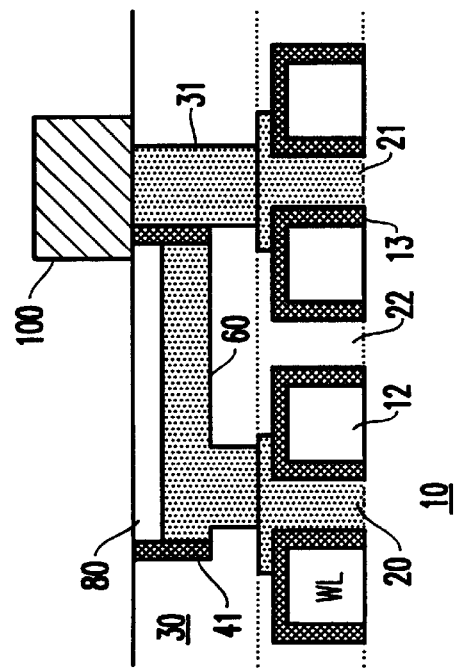
FIG. 12 is a schematic diagram of a cross-sectional view of an integrated circuit according to the invention.

Referring now to the drawings and more particularly to FIGS. 1–12 a preferred embodiment of the invention is illustrated. The completed structure, shown in FIG. 12, illustrates that the sidewall spacers 41 are formed within the opening 44 for the bitline 60 and the opening for the capacitor contact 31 is not reduced by the spacers 41. Therefore, as mentioned above, the more critical capacitor contact size is maintained, which allows the device to be manufactured on a smaller scale without increasing the defect rate or decreasing in the effectiveness of the device.

Referring now to FIG. 1, a silicon substrate 10 having a transistor, such as a field effect transistor (FET) including a shallow trench isolation region 11 (STI) and source, drain and p-well regions 121, 120 (shown in the completed structure in FIG. 12) is formed using conventional deposition, etching and doping processes. The substrate could comprise, for example, a P-type single crystal silicon having a (100) crystallographic orientation. The structure in FIG. I also includes wordlines 12 and a protective insulating layer 13 surrounding the wordlines 12.

In FIG. 2 an insulator 22, is deposited over the insulating layer 13. The insulating layer 22 could comprise, for example, silicon oxide formed by a low temperature chemical vapor deposition (CVD) process using tetraethylorthosilicate (TEOS). Alternatively, the insulation layer could be formed, for example by an atmospheric TEOS process at a temperature in the range of between about 690° and 720° C. Also, the dielectric layer could be formed of silicon nitride, an oxide/nitride/oxide (ONO) film or borophosphosilicate glass (BPSG). Preferably, chemical mechanical polishing may be used to planarize layer 22. To planarize the first insulation layer 30, a spin-on-glass (SOG) layer having a thickness of about 2000 Å is formed over the insulation layer. Next, an oxide etch is used to etch back the spin-on-glass layer and the insulation layer to form a planar surface.

Standard lithography techniques are used to pattern the insulating layer 22 to form openings for the self-aligned contact (SAC) bitline contact base 20 and the self-aligned contact (SAC) capacitor contact base 21. For example, the insulating layer 22 could be anisotropically etched in a reactive ion etch (RIE) using a mixture of $C_4F_8$, $C_3F_8$, $CH_2F_2$, CO, Ar, $O_2$ etchants in a timed mode. The anisotropic etch has a high selectivity and etches silicon oxide at a much higher rate (e.g. 200 times) than it etches silicon nitride or silicon.

A conductive material such as a metal, alloy or polysilicon is deposited in the openings to form the bitline contact base 20 and capacitor contact base 21. The conductive layer could be formed of any conductive material, metal or alloy and is preferably formed of a polysilicon layer and/or a tungsten silicide ($Wsi_x$) layer. The polysilicon layer could have a thickness in the range of between about 300 Å to 10,000 Å and more preferably about 5,000 Å and a doping concentration in the range of between about 1E20 and 1E21 atoms/$cm^2$. The tungsten silicide layer could have a thickness in the range of between about 3,000 Å to 10,000 Å and more preferably about 5,000 Å. For example, the doped polysilicon conductive layer could be formed using a liquid phase chemical vapor deposition (LPCVD) reactor at a process temperature of between about 550° to 650° C. The polysilicon layer could be doped with an N-type ion implantation using, for example, arsenic ions having an implant dose of between about 1E15 to 20E15 atoms/$cm^2$ and an ion energy of between about 20 to 80 Kev. Alternatively, the polysilicon layer can be doped in situ during the polysilicon deposition or an undoped polysilicon layer can be doped by a subsequent overlying layer.

In FIG. 3 an inter-layer dielectric 30, such as those insulators discussed above, is deposited over the structure and patterned, again using standard lithography techniques, to form an opening for the capacitor contact 31. The opening is filled with conductive material, such as those discussed above, to form the capacitor contact 31 and a protective cap 32 (e.g., SiN) is formed over the capacitor contact 31 by recessing the capacitor contact 31, depositing the protective cap 32, and planarizing the protective cap using, for example, chemical mechanical polishing to leave the protect cap 32 over the capacitor contact 31. The capacitor contact 31 is electrically connected to the capacitor contact base 21.

An insulating material 41, such as those discussed above, is deposited over the structure and etched in a selective etch, such as reactive ion etch (RIE), which removes material from the horizontal surfaces and allows the spacer material 41 to remain on the vertical surfaces of the bitline opening 40. Therefore, the bitline opening 40 is self-aligned with the capacitor contact 31.

Standard lithography techniques are again used to form an opening 40 for the bitline, as shown in FIG. 4. The capacitor cap 32 protects the capacitor contact 31 during the etching of the bitline trench 40. Further, the capacitor cap 32 aligns the bitline trench 40 with the capacitor contact 31.

Figure 5:
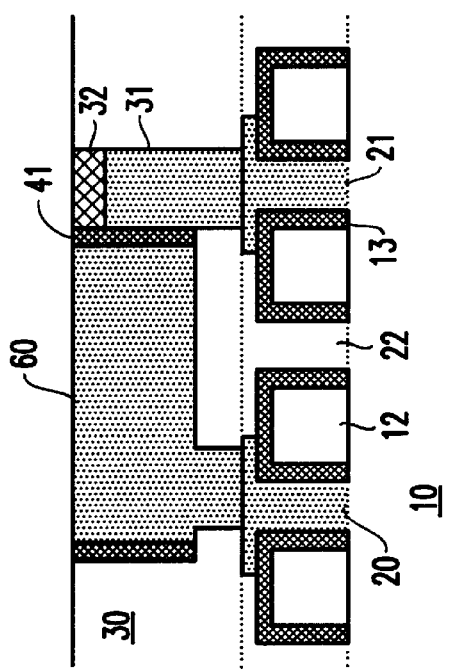
FIG. 5 is a schematic diagram of a cross-sectional view of a partially formed integrated circuit according to the invention.
Figure 6:
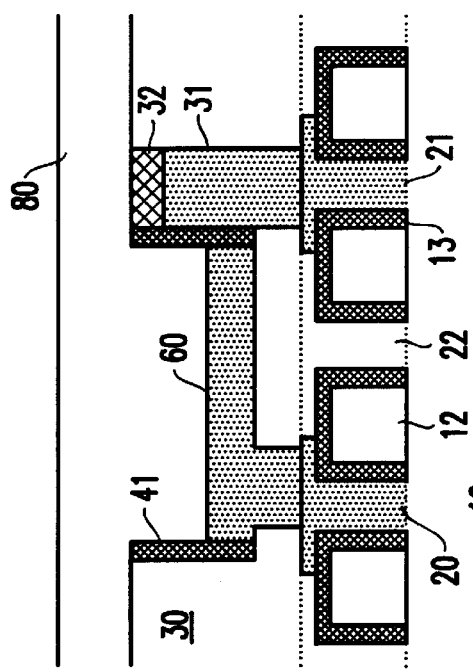
FIG. 6 is a schematic diagram of a cross-sectional view of a partially formed integrated circuit according to the invention.

FIG. 5 illustrates the formation of the bitline contact opening 50 which, again, is formed by standard lithographic techniques. In FIG. 6 the bitline opening 40 and bitline contact 50 are filled with a conducted material using, for example, a damascene process, such as those discussed above, to form the bitline and bitline contact 60. The bitline contact is then planarized using conventional planarization techniques such as chemical mechanical polishing (CMP).

Figure 7:
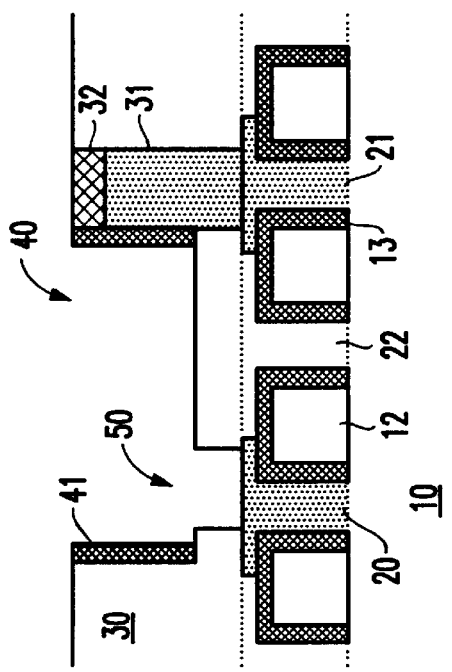
FIG. 7 is a schematic diagram of a cross-sectional view of a partially formed integrated circuit according to the invention.
Figure 8:
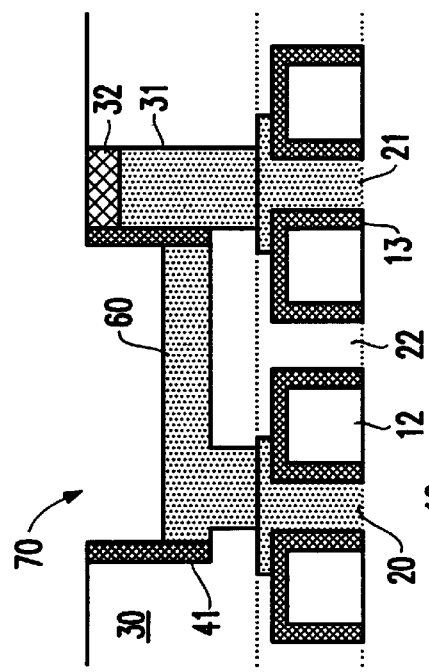
FIG. 8 is a schematic diagram of a cross-sectional view of a partially formed integrated circuit according to the invention.
Figure 9:
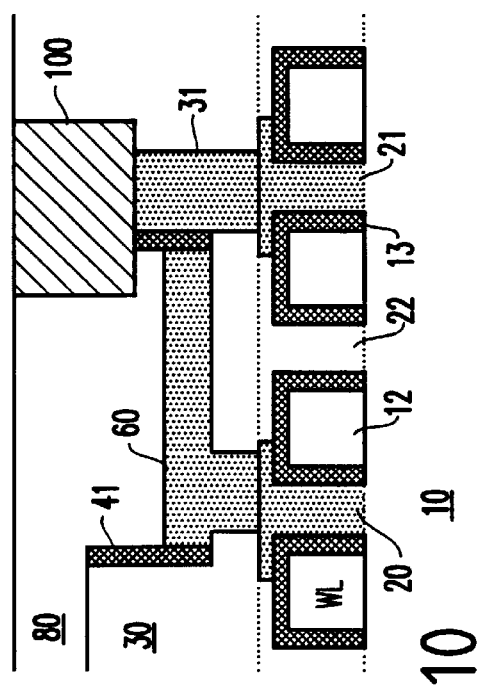
FIG. 9 is a schematic diagram of a cross-sectional view of a partially formed integrated circuit according to the invention.

In FIG. 7, the bitline 60 is recessed below the capacitor contact 31 using a wet or dry etch. In this process, the capacitor contact 31 is protected by the cap 32. As shown in FIG. 8 an additional layer of dielectric 80, such as those discussed above, is deposited over the structure and planarized, again using conventional planarization techniques.

A capacitor opening 90 is formed above the capacitor contact 31, as shown in FIG. 9, again using standard lithographic techniques. This etching process also removes the protective cap 32 to expose the conductive material 31 within the capacitor contact. As shown in FIG. 10, a conductive capacitor material 100, such as those discussed above, is deposited in the capacitor opening 90. The conductive capacitor material is then planarized using for example CMP. Alternatively, the capacitor may be formed using a standard lithography and RIE process as shown in FIG. 11. In this case the dielectric 80 has previously been planrized to expose and open cap 32. The final FIG. 12 is similar to FIG. 11 but includes more details regarding the transistor below the wordline 12 (e.g., the source/drain 121 and p-well 120).

Figure 13:
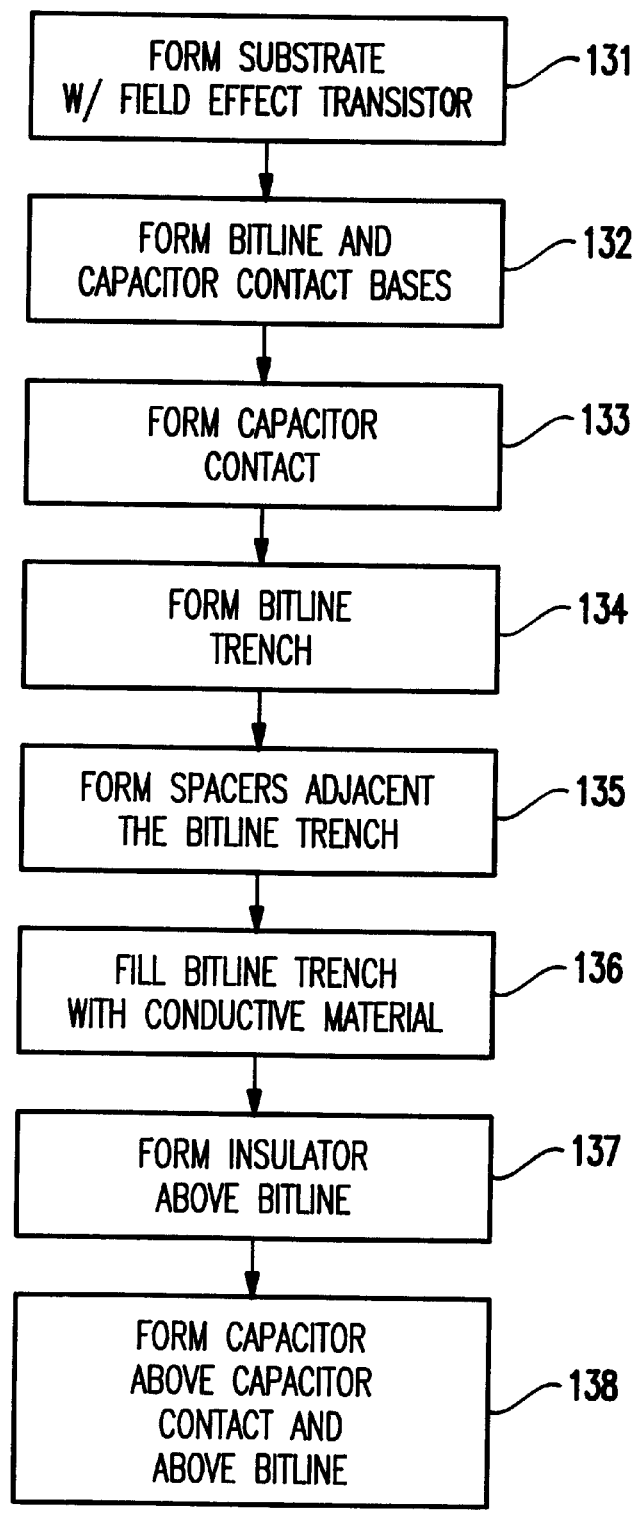
FIG. 13 is a flowchart illustrating a preferred method of the invention.

FIG. 13 is a flowchart summarizing the above-described embodiment of the invention. More specifically, item 131 in FIG. 13 illustrates the formation of the substrate 10 including the field effect transistor. Item 132 shows the formation of the bitline contact base 20 and the capacitor contact base 21. In item 133 the capacitor contact 31 is formed. In item 134 the bitline trench 40 is formed and in item 135 the spacers 41 are formed on the sides of the bitline trench.

In item 136 the bitline trench 40 is filled with a conducted material 60. In item 137 the insulator 80 is formed above the bitline 60. In item 138 to the capacitor 100 is formed above the capacitor contact 31 and above the bitline 60.

As can be seen in FIG. 12, the capacitor 100 is sufficiently insulated from the bitline 60 by the dielectric material 80 to prevent electrical shorting between the bitline 60 and the capacitor 100. Further, the capacitor contact 31 is similarly well insulated from the bitline 60 by the insulating spacers 41. Additionally, the size of the capacitor contact 31 is not reduce by the invention because the spacers 41 are formed in the opening 40 for the bitline 60. Therefore, the more critical capacitor contact 31 maintains its size while the less critical bitline 60 is somewhat reduced in size.

Those skilled in the art will recognize that this method and structure provide a self-aligned damascene interconnect. The capacitor 100 may be a wire level, contact 21 may be another wire level so that a contact is made between upper wire level 100 and lower wire level 21 without contacting the intermediate bitline wire level 60.

Figure 14:
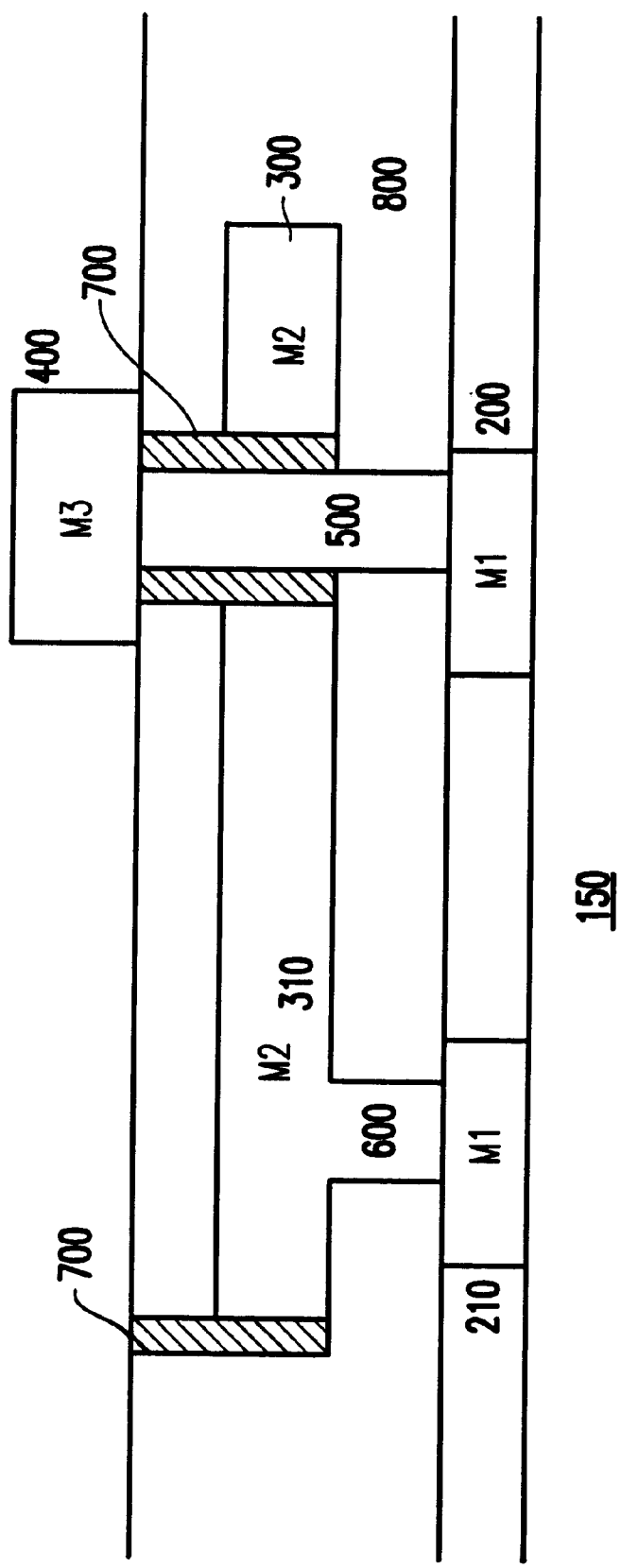
FIG. 14 is a schematic diagram of a cross-sectional view of an integrated circuit wiring structure according to the invention.

While a self-aligned DRAM bitline structure is used above to illustrate the invention, as would be known by one ordinarily skilled in the art, the invention is equally applicable to any similar wiring structure. For example, FIG. 14 shows a cross-sectional representation of an embodiment of the invention which is a general multilevel interconnection structure including a substrate 150, a lower metal wiring level 200 connected to an upper metal wiring level 400 by a stud level 500 which is electrically isolated from intermediate tight-pitch wiring levels 300 and 310 using the technique described previously. The contact stud 600 can serve to interconnect intermediate wiring level 310 with lower wiring level 210. An oxide dielectric 800 is formed around the wiring and stud structures 400, 500. Stud 500 is self-aligned to and electrically isolated from the wire levels 300 and 310 using the processes described above. Further, the stud 500 is formed before the wiring level 300, 310 and the spacers 700 are formed on the outer layer of the stud 500, using the process described above. Therefore, the size of the stud 500 is not reduced by the spacers 700 and, therefore, the stud 500 does not suffer from performance degradation because of the spacers 700.

Thus, as described above, the invention allows a smaller stacked structures to be manufactured, which allows for a higher density integrated circuit device, decreases manufacturing costs, decreases defects and increases efficiency.

While the invention has been deseribed in terms of preferred embodiments, those skilled in the art will recognize that the invention can be practiced with modification within the spirit and scope of the appended claims.

Having thus described our invention, what we claim as new and desire to secure by Letters Patent is as follows:

1. A method of manufacturing a capacitor-over-bitline integrated circuit device comprising:

forming a device on a substrate;

forming a capacitor contact electrically connected to said device;

forming a bitline trench using a sidewall of said capacitor contact to align said bitline trench;

forming insulating spacersin said bitline trench;

forming a conductive bitline in said trench, said bitline being electrically connected to said device;

forming an inter-layer dielectric over said bitline; and forming a capacitor above said inter-layer dielectric, such that said capacitor is electrically connected to said capacitor contact.

2. The method in claim 1, wherein said forming of said insulating spacers includes forming one of said insulating spacers on said capacitor contact.

3. The method in claim 1, wherein said forming of said capacitor contact includes forming a cap above said capacitor contact, wherein said cap protects said capacitor contact during said forming of said bitline trench and said cap aligns said bitline trench with said capacitor contact.

4. The method in claim 1, wherein said forming of said bitline comprises depositing a conductive material in said bitline trench using a damascene process.

5. The method in claim 1, wherein said forming of said device comprises forming a field effect transistor.

6. The method in claim 1, wherein a size of said capacitor contact is unaffected by said insulating spacers.

7. A method of manufacturing a multilevel interconnection comprising:

forming a device;

forming a contact electrically connected to said device;

forming a trench using a sidewall of said contact to align said trench;

forming spacers in said trench;

forming a first conductor in said trench, said first conductor being electrically connected to said device;

forming an insulator over said first conductor; and forming a second conductor above said insulator, such that said second conductor is electrically connected to said contact.

8. The method in claim 7, wherein said forming of said spacers includes forming one of said spacers on said contact.

9. The method in claim 7, wherein said forming of said contact includes forming a cap above said contact, wherein said cap protects said contact during said forming of said trench and said cap aligns said trench with said contact.

10. The method in claim 7, wherein said forming of said first conductor comprises depositing a conductive material in said trench using a damascene process.

11. The method in claim 7, wherein said forming of said device comprises forming a field effect transistor.

12. The method in claim 7, wherein a size of said contact is unaffected by said spacers.

13. A method of manufacturing a multilevel interconnection comprising:

forming a first wiring level;

forming a first insulator over said first wiring level;

forming a contact electrically connected to said first wiring level;

forming a trench in said insulator using a sidewall of said contact to align said trench;

forming spacers in said trench;

forming an intermediate wiring level in said trench;

forming an insulator over said intermediate wiring level; and forming a second wiring level above said insulator, such that said second wiring level is electrically connected to said contact.

14. The method in claim 13, wherein said forming of said spacers includes forming one of said spacers on said contact.

15. The method in claim 13, wherein said forming of said contact includes forming a cap above said contact, wherein said cap protects said contact during said forming of said trench and said cap aligns said trench with said contact.

16. The method in claim 13, wherein said forming of said intermediate wiring level comprises depositing a conductive material in said trench using a damascene process.

17. The method in claim 13, wherein a size of said contact is unaffected by said spacers.

* * * * *